US006232836B1

(12) United States Patent
Zhou (10) Patent No.: US 6,232,836 B1
(45) Date of Patent: May 15, 2001

(54) IN-LINE, UNBALANCED AMPLIFIER, PREDISTORTION CIRCUIT (75) Inventor: Shutong Zhou, Horsham, PA (US)

(73) Assignees: General Instrument Corporation, Horsham, PA (US); Motorola Inc., Shaumberg, IL (US)

( * ) Notice: Subject to any disclaimer, the term of this patent is extended or adjusted under 35 U.S.C. 154(b) by 0 days.

(21) Appl. No.: 09/568,743

(22) Filed: May 11, 2000

Related U.S. Application Data (63) Continuation of application No. 09/154,770, filed on Sep. 17, 1998, now Pat. No. 6,133,790.

(51) Int. Cl.[7] ....................................................... H03F 1/26
(52) U.S. Cl. ............................................ 330/149; 330/150
(58) Field of Search ................................. 330/124 R, 149, 330/150, 165, 276, 301

(56) References Cited

U.S. PATENT DOCUMENTS

| | | | |
|---|---|---|---|
| 4,011,518 | 3/1977 | Irvine et al. | 330/23 |
| 4,532,477 | 7/1985 | Green, Jr. et al. | 330/149 |
| 4,564,816 | * 1/1986 | Kumar et al. | 330/149 |
| 4,682,119 | 7/1987 | Michel | 330/149 |
| 5,119,392 | 6/1992 | Childs | 372/38 |
| 5,132,639 | 7/1992 | Blauvelt et al. | 330/149 |
| 5,252,930 | * 10/1993 | Blauvelt | 330/149 |
| 5,258,722 | * 11/1993 | Jeffers | 330/149 |
| 5,282,072 | * 1/1994 | Nazarathy et al. | 330/149 X |
| 6,111,465 | * 8/2000 | Kakuta et al. | 330/276 |
| 6,133,790 | * 10/2000 | Zhou | 330/149 |

FOREIGN PATENT DOCUMENTS

| | | |
|---|---|---|
| 35 26 748 | 1/1987 | (DE) . |
| 196 16 803 | 10/1996 | (DE) . |

OTHER PUBLICATIONS

Rodrigo Cordeiro Tupynamba et al., "Mesfet Nonlinearities Applied to Predistortion Linearizer Design, International Microwave Symposium Digest 9MTT–S" US, New York, IEEE, vol. II, p. 955–958 XP000343462.

* cited by examiner

Primary Examiner—Steven J. Mottola
(74) Attorney, Agent, or Firm—Ronald P. Kananen; Rader, Fishman & Grauer (57) ABSTRACT A plurality of amplifiers are connected in cascade to form an in-line predistortion circuit. The amplifiers are unbalanced in that each amplifier stage in the circuit has two DC voltage rails which are independently controlled to provide different, i.e. offset, DC voltage levels to the unbalanced amplifiers. This unbalance in the amplifiers generates predistortion in a signal which can be used to cancel the inherent distortion caused by a non-linear device which subsequently processes or transmits the predistorted signal. Control of the DC voltage offset in at least one of the amplifier stages is necessary to match the predistortion to the inherent distortion being corrected. A tilt circuit can be used in cascade with the plurality of amplifiers (in front of the RF amplifiers) to compensate the amplitude change caused by the unbalanced RF amplifiers. Either side of the DC voltage can be changed in order to correct for either sublinear or superlinear laser diode curves.

22 Claims, 4 Drawing Sheets

IN-LINE, UNBALANCED AMPLIFIER, PREDISTORTION CIRCUIT

This application is a continuation of application Ser. No. 09/154,770 filed Sep. 17, 1998 and now U.S. Pat. No. 6,133,790.

FIELD OF THE INVENTION

The present invention relates to the field of predistortion circuits used to compensate for and correct distortion in non-linear signal processing devices. More particularly, the present invention relates to a novel circuit for reducing second order distortion in the optical modulation of an optical signal used for transmission of a video signal.

BACKGROUND OF THE INVENTION

Optical signals carried over fiber optic networks provide an optimal means of transmitting information. In basic principle, a laser signal source flashes light into one end of a fiber optic link. These flashes of light travel through the fiber optic cable. When the flashes of laser light reach the other end of the fiber optic link, they are detected by a light detector.

In this manner, information can be coded into the flashes of laser light emitted by the laser and decoded after the optical signal is detected by the light detector. Such an optical signal can carry large amounts of data and is, therefore, an excellent medium of transmitting video signals, for-example, CATV or digital CATV signals.

One method of coding information into an optical signal is to vary or modulate the intensity of the flashes. Circuitry receiving the output from the light detector can then decode the transmitted data into a useable form. This is called amplitude modulation. Due to the non-linearity generated by the laser, it will produce distortion signals. These distortion signals will interfere with the original signal.

This problem with distortion in signal processing due to the non-linearity of a signal processing device is not limited to the example given here of a laser transmitting an optical signal. The difficulty with distortion caused by non-linearity arises in many signal processing contexts. For example, a circuit element as basic as an amplifier amplifying an electronic signal may be non-linear and distort the processed signal under some circumstances.

In the context of the present example, distributed feedback lasers (DFB lasers) are preferred for the transmission of optical data signals. The performance of DFB-lasers is limited primarily by second-order distortion. Particularly, the optical modulation depth (OMD) that can be created by a laser being-used as the source of an optical signal is limited by this second-order distortion. This is important because the OMD determines the quality of the signal transmitted.

For example, an optical signal may be used to transmit a video signal using an AM frequency carrier signal. In such a signal, the carrier to noise ratio, which defines the clarity of the signal, is proportional to the square of the OMD. Thus, using some means to reduce second-order distortion will help by increasing the optical modulation depth and greatly improve the dynamic range of the transmission. The result is a superior image at the end of the video transmission.

Accordingly, there is a need for a method and apparatus which can compensate for and correct distortion in nonlinear signal processing elements, e.g. a non-linear laser light source generating a modulated optical signal.

Various attempts have been made to address this problem. In basic principle, the popular solution calls for a predistortion circuit which is used to distort the signal before it is processed by the non-linear processing element. This predistortion is matched to the distortion that will be caused during processing by the non-linear processing element so as to cancel out that distortion.

Figure 1:
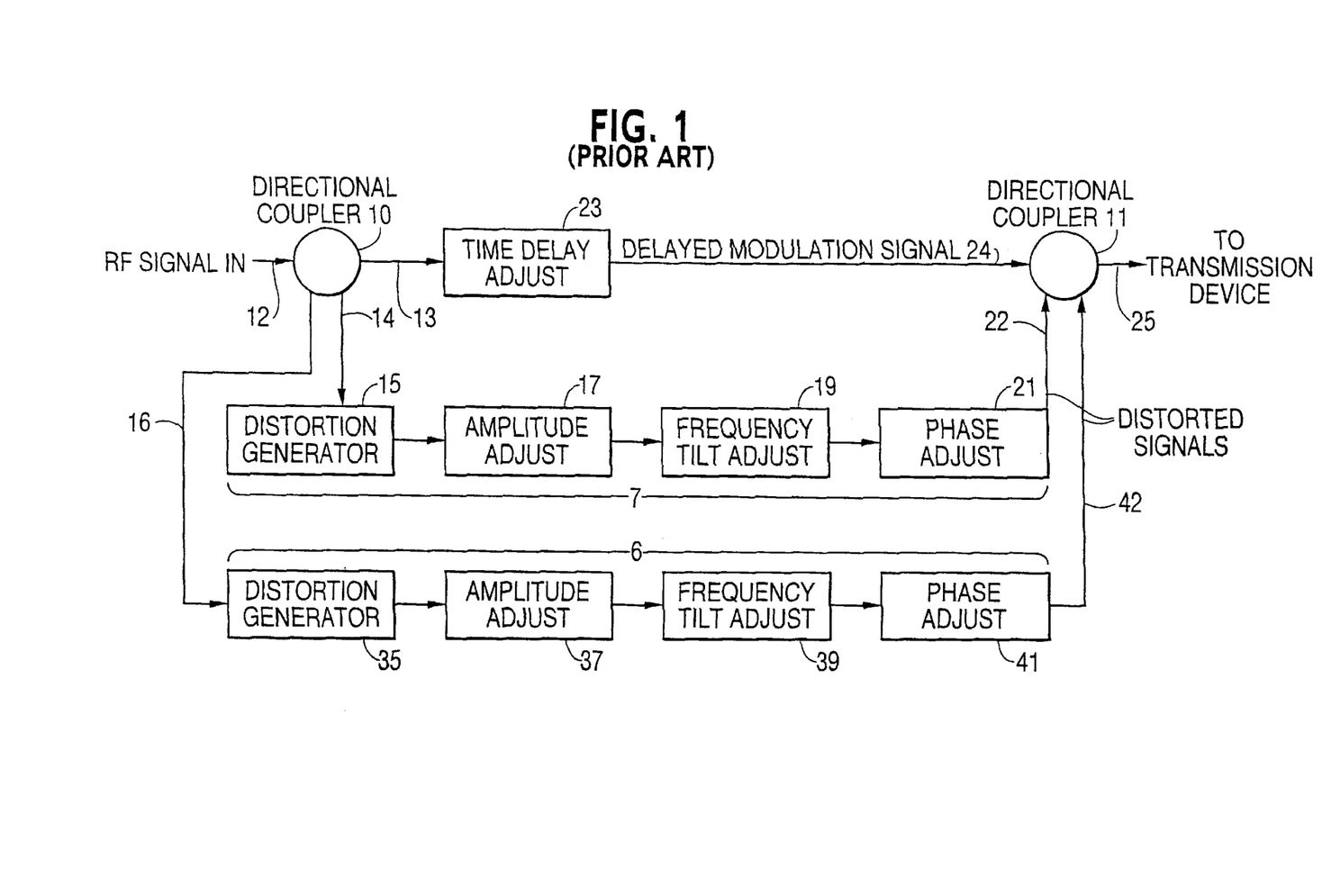
FIG. 1 is a block diagram of a conventional predistortion circuit.

For example, U.S. Pat. No. 5,132,639 issued Jul. 21, 1992 to Blauvelt et al. proposed a predistortion circuit which is illustrated in FIG. 1. As shown in FIG. 1, an RF input signal on line 12 is fed into a directional coupler 10. The directional coupler 10 splits the input signal into a primary electrical path 13 and two secondary electrical paths 14 and 16. Typically the signal on the primary electrical path 13 is substantially higher in power than the signal on the secondary electrical paths 14 and 16. For example, an 11 dB directional coupler 10 may be used to achieve this result.

Typically, the primary electrical path 13 includes a time delay adjustment element 23 to produce a delayed modulation signal on line 24. The delayed modulation signal is then input to a second directional coupler 11.

The first secondary electrical path 14 includes, in series, distortion generator 15, an amplitude adjustment circuit 17, a frequency adjustment circuit 19, and a fine phase adjustment circuit 21. The signal output by the fine phase adjustment circuit 21 is provided on line 22 to the second-directional coupler 11.

The signal output by the distortion generator 15 includes non-linear distortion of the input signal frequencies. The distortion in the output signal from the distortion generator is matched in magnitude with 180 degrees phase shift to the distortion inherently caused by the transmission device (not shown), e.g. a laser generating an optical signal, which receives and transmits the output signal on output line 25.

The second directional coupler 11 combines the signal from the primary path 24 with the distorted signal from line 22. The distortion produced by the transmission device will be cancelled out by the predistortion signal. So that, ideally, a signal with no remaining distortion is received after transmission.

The first secondary path 7 in FIG. 1 may be supplemented by a second secondary path 6. Like the first, the second secondary path 6 includes, in series, a distortion generator 35, an amplitude adjustment circuit 37, a frequency adjustment circuit 39 and a fine phase adjustment circuit 41. Second secondary path 6 provides an output signal on line 42 which is combined with the output signal on line 22 from the first secondary path 7 by the second directional coupler 11. In this example, the second-secondary path 6 would be used to generate third-order distortion in the transmission signal to cancel third-order distortion caused by the transmission device (not shown).

Another prior attempt to solve the non-linear distortion problem is found in U.S. Pat. No. 5,119,392 issued Jun. 2, 1992 to Childs. Childs attempts to correct second-order distortion by using a field effect transistor (FET) biased for square law operation to make corrections in the transmission signal. The FET is connected in-line with a laser generating an optical transmission signal. Due to field and doping dependent variations in the carrier mobility within the transistor, it is difficult to obtain a FET with ideal square law operation. The performance of this type of predistortion circuit is limited.

Accordingly, there remains a need in the art for a very simple method of generating predistortion to counter the distortion created by a non-linear signal processing element, e.g. a optical signal generator.

SUMMARY OF THE INVENTION

It is an object of the present invention to meet the above-described needs and others. Specifically, it is an object of the present invention to provide a much simpler method, as compared to the prior art, of correcting for distortion and consequently achieving high performance. This is the in-line unbalanced RF amplifier predistorion circuit.

Additional objects, advantages and novel features of the invention will be set forth in the description which follows or may be learned by those skilled in the art through reading these materials or practicing the invention. The objects and advantages of the invention may be achieved through the means recited in the attached claims.

To achieve these stated and other objects, the present invention may be embodied as an in-line predistortion circuit having a plurality of amplifier stages connected in cascade for receiving and predistorting a signal prior to the signal being provided to a non-linear signal processing element. Because laser transmitters always use RF amplifiers, the cascade RF amplifier of the present invention is not an extra element added to the laser transmitter, but rather an improvement of an existing element. The unbalanced RF amplifier of present invention will be used as an ordinary RF amplifier and predistortion circuit, thereby greatly simplifying the whole circuit.

Each of the amplifier stages includes a pair of voltage rails for supplying a pair of DC voltage levels. The pair of DC voltage levels supplied to at least one of the amplifier stages is made unequal to effect the predistorting.

The first of the amplifier stages preferably includes an input terminal to which the signal is provided; an amplifier; and a balun having a primary winding connected between the input terminal and a first input terminal of the amplifier, and a secondary winding connected between ground and a second input terminal of the amplifier. Preferably, a first capacitor is connected between the primary winding and the first input terminal of the amplifier; and a second capacitor is connected between the second winding and the second input terminal of the amplifier.

The second or final stage of the plurality of amplifier stages preferably includes: an output terminal to which the signal is provided after processing by the plurality of amplifier stages; an amplifier; a balun having a primary winding connected between the output terminal and a first output terminal of the amplifier, and a secondary winding connected between ground and a second output terminal of the amplifier. Preferably, a first capacitor is connected between the first output terminal of the amplifier and the primary winding; and a second capacitor is connected between the second output terminal of the amplifier and the secondary winding. If only two stages are used, the second stage is preferably connected to the first stage through capacitors.

Preferably, the present invention also includes an impedance matching element connected to an output terminal of the plurality of amplifier stages.

Additionally, the circuit of the present invention preferably includes a tilt circuit. The output of the tilt circuit is connected to an input of the plurality of amplifier stages. The tilt circuit preferably includes: a capacitor, a resistor and a pair of resistors in series which are connected in parallel; and a resistor and an inductor connected in series between ground and a point between the two resistors in series.

The present invention also encompasses a method of providing predistortion in an electronic signal by predistorting the signal by providing unequal DC voltage levels over a pair of voltage rails to at least one of a plurality of amplifier stages through which the signal is passing. This can be done by lowering one side of the DC supply voltage.

Preferably, the method further includes controlling the predistortion by controlling the difference between the DC voltage levels supplied over the pair of voltage rails to the at least one of a plurality of amplifier stages; and matching impedance with an impedance matching element connected to an output terminal of the plurality of amplifier stages. Either side of the DC supply voltage rails may be controlled in order to create the desired predistortion to, for example, correct for either sublinear or superlinear laser diode curves.

BRIEF DESCRIPTION OF THE DRAWINGS

The accompanying drawings illustrate the present invention and are a part of the specification. Together with the following description, the drawings demonstrate and explain the principles of the present invention.

DETAILED DESCRIPTION OF THE PREFERRED EMBODIMENTS

The present invention provides a predistortion circuit that is cascaded with a non-linear signal processing element, such as an electro-optic device like a semiconductor DFB laser, to compensate for and correct distortion caused by the signal processing element during signal processing. An embodiment of a circuit according to the present invention is illustrated in FIG. 2.

Figure 2:
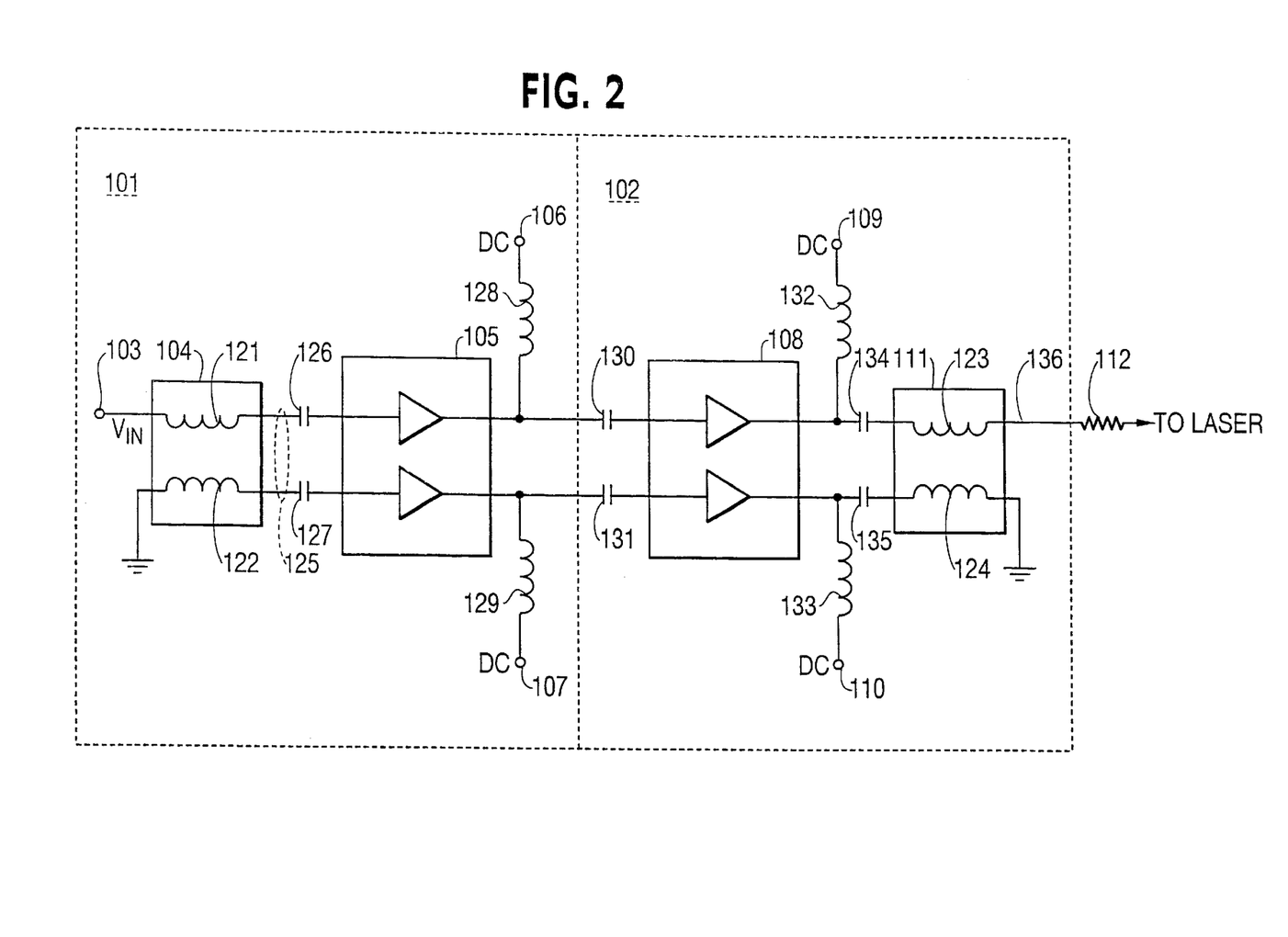
FIG. 2 is a circuit diagram of a predistortion circuit according to the present invention.

As shown in FIG. 2, a predistortion circuit of the present invention may include two unbalanced RF amplifiers 101 and 102 that are cascaded with each other. In operation, an input signal is provided to terminal 103 of the first amplifier 101, i.e. the first stage of the predistortion circuit. This input signal passes through the two cascaded RF amplifiers 101 and 102, and is output to terminal 136. From terminal 136, the signal is provided to a non-linear signal processing element (not shown), e.g. an optical signal generator such a DFB laser, as will described below.

After being input to terminal 103, the input signal passes through-the primary winding 121 of a balun 104. The secondary winding 122 of the balun 104 is-connected between ground and one of two input terminals of an amplifier 105. The outputs from the primary 121 and secondary 122 windings of the balun 104 are provided through capacitors 126 and 127, respectively, as a pair of signals 125 to the input stage of the amplifier 105.

The pair of signals 125 output by the balun 104 are of equal amplitude, but are 180° out of phase. Subsequently, a pair of output signals are provided by the amplifier 105, through capacitors 130 and 131, respectively, to the input stage of a second amplifier 108, the second stage of the predistortion circuit.

The paired signals are then output by the second amplifier 108 and provided, through capacitors 134 and 135, respectively, to a second balun 111. The secondary winding 124 of the second balun 111 is connected to ground. The primary winding 123 of the second balun 111 is connected to output terminal 136.

As noted above, the signal provided to output terminal 136 is provided to a non-linear signal processing element, e.g. an optical signal generator (not shown). A resistor 112 or, alternatively, a transformer, may be used to match the output impedance of the amplifier 108.

Each of the RF unbalanced amplifiers 101 and 102 has two DC supply rails, 106, 107, and 109, 110, respectively. The four DC supply rails each incorporate an inductor, 128, 129, 132 and 133, respectively. The RF unbalanced amplifiers 101 and 102 are designed or selected such that if both DC supply rails connected thereto are live and supplied with an equal, or balanced, predetermined voltage, the amplifiers 101 and 102 are normal RF amplifiers. Under such circumstances, the amplifiers 101 and 102 provide pure amplification of the input signal with negligible distortion.

However, if the DC voltage provided to one of the amplifiers differs between the two rails supplying that amplifier, the amplifier is "unbalanced" and the voltage supplied is "offset". This voltage offset of the unbalanced amplifier 105 and/or 108 can be used to cancel second-order distortion produced by the down-stream non-linear signal processing element (not shown).

As described, the necessary voltage offset is obtained by unbalancing the DC voltage levels provided over each pair of DC rails 106, 107, and 109, 110. For example, in each pair of DC rails, 106, 107 and 109, 110, the DC voltage provided on one of the rails may be lowered to create the desired voltage offset.

The optimal voltage offset needed to reduce distortion caused by a non-linear signal processing element is dependent on a number of factors, most prominently, the exact type and characteristics of the non-linear element used. For example, where the non-linear element is a laser, the laser bias condition, the balanced amplifier used, the arrangement of the amplifiers and the characteristics of the matching transformer are all relevant.

Accordingly, the optimal voltage offset for correcting distortion in any particular system cannot be calculated, but must be determined by experimental adjustment. Different voltage offsets over the pairs of the DC supply rails 106, 107 and 109, 110 can be used to correct for either sub-linear or super-linear laser diode curves which result in signal distortion.

Contrary to the prior art, in the circuit of the present invention, there is no need for RF directional couplers, delay lines, balancing of the delay lines, filters, RF switches (jumpers), additional distortion generators, amplitude adjustment of the RF signals, frequency tilt and phase adjustment elements.

It is possible that the RF adjustment elements of the circuit in FIG. 1 may introduce unwanted phase shifts and/or parasitic phase shifts across the RF frequency band. The introduction of such unwanted phase shift across the RF frequency band will degrade the final correction result. Moreover, the delay line is difficult to adjust and the final results are not very reliable. However, the use of high quality unbalanced amplifiers as the amplifiers 101 and 102 generally eliminates these problems, greatly improves the performance of the correction circuit, and simplifies the adjustments that must be made because, in this case, the only parameters which must be adjusted are DC voltages. DC voltage adjustments are always easier to make than any RF adjustments.

Additionally, the input stage balun 104 and output stage balun 111 can be replaced by transformer configurations without departing from the sprit and scope of the invention.

This correction circuit can be arranged with the laser in a very small area, thus further reducing any parasitic parameters. Consequently, the entire predistortion circuit is very simple and robust.

Using the example of lasers as non-linear optical signal generators, the theory underlying the present invention may be explained as follows. Under fixed bias and RF input conditions, lasers produce inherent non-linearity. If beats vector $V_1$ is used to represent the laser distortion for one particular frequency, a predistortion circuit provides a complementary vector $V_2$ that has the same amplitude with 180° phase difference to the laser distortions. Accordingly, $V_2$ may be used to cancel the laser distortion, $V_1$.

Once the OMD of the laser reaches the clipping point, and the composite second-order distortion (CSO) and composite triple beat distortion (CTB) are controlled, i.e., CSO and CTB are less than −65 dBc, further reduction of laser distortion does not improve the performance of the system as a whole. Accordingly, it is not always necessary for the laser predistortion circuit to realize total cancellation of the distortion in order to optimize the performance of the HFC system. This is especially true for CSO distortion because for an HFC network, the RF amplifiers used after a laser transmitter usually have very low CSO distortions.

Figure 3:
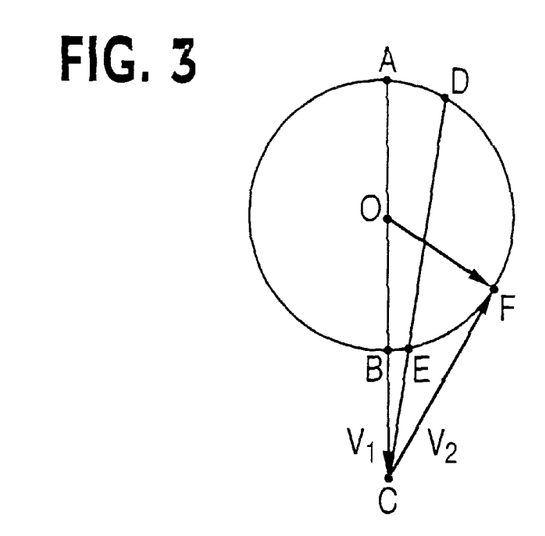
FIG. 3 is a mathematical graph illustrating the principles underlying the present invention.

FIG. 3 illustrates graphically how the predistortion circuit works. OC represents a laser distortion vector $V_1$. CF represents correction vector $V_2$. There is an angle of deviation $\angle$ OCF=θ between OC and CF because the two vectors are not perfectly matched. OF represents the final correction error. As drawn in FIG. 3, the circle radius r=OF. All correction vectors $V_2$ terminating within this circle will produce better final correction results than OF. If the phase deviation is θ, the maximum correction that can be obtained will be less than 20 log (sin θ) regardless of how the amplitude of the correction signals is controlled.

This means that if a phase deviation of 11.5° is present across the entire frequency band, the correction results cannot be better than 14 dB. With a phase deviation of 18° over the entire frequency band, the correction results cannot improve over 10 dB.

FIG. 3 illustrates that a moderate correction can be obtained if the phase deviation is well controlled. For example, assume the amplitude of the laser distortion vector OC is −59 dBc. CB and CA are the correction vectors that are exactly 180° opposite to the laser distortion vector. In this example, their amplitudes are −65 dBc and −55.5 dBc. The correction signals within this amplitude range can correct laser distortion to better than −65 dBc. Note that the amplitude tolerance is 9.5 dB.

CD and CE show that the correction vectors $V_2$ have the same phase deviation with the laser distortion vector $V_1$. The correction vectors amplitude between CD and CE can correct laser distortion to better than −65 dBc. Because DE<AB, the correction amplitude tolerance is reduced.

CF shows that the correction vectors $V_2$ have 30° deviation with the laser distortion vector $V_1$. Under these circumstances, only one correction vector amplitude can be used to optimally correct the laser distortion. This correction vector amplitude is equal to −60.25 dBc. Other correction vectors will always result in a less satisfactory correction.

FIG. 3 illustrates the importance of phase matching. If the correction signal is not 180° out of phase with the laser distortion signals, then making the correction signal amplitude equal to the laser distortion signal will not produce optimal distortion correction.

Figure 4:
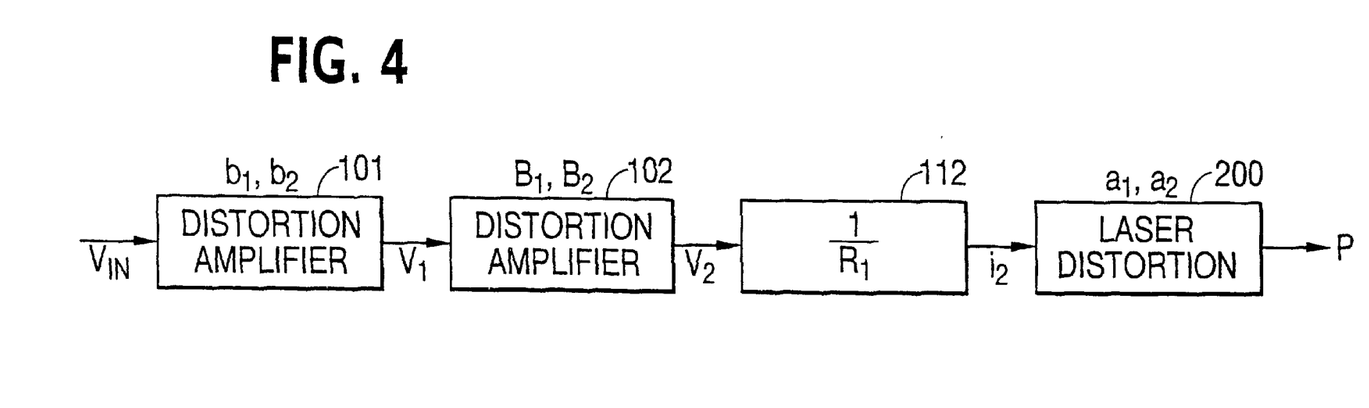
FIG. 4 is a block diagram illustrating the operation of the circuit illustrated in FIG. 2.

Turning back to the present example, FIG. 4 graphically illustrates the signal processing of the circuit of FIG. 2. In this example, a laser device is used with a mild non-linearity. Consequently, the laser power P can be represented by the first two terms in the power series of the laser current i as:

$$P = a_1 * i_2 + a_2 * i_2^2 \quad (1)$$

where $a_1$ and $a_2$ are constants.

Both stages of the circuit, amplifiers 101 and 102, are used by offsetting the DC level on the rails 106, 107 and 109, 110 of both the first and second amplifiers 101 and 102. Consequently, the transfer function of the circuit is of the form:

$$v_2 = B_1 v_1 + B_2 v_1^2 \quad (2)$$

$$v_1 = b_1 v_{in} + b_2 v_{in}^2 \quad (3)$$

where $B_1$, $B_2$, $b_1$, and $b_2$ are constants. Terms higher than second-order have been omitted from equations (1) to (3)

Using a resistor 112 with resistance $R_1$ to match the amplifier output impedance gives:

$$i_2 = v_2 / R_1 \quad (4)$$

Assuming that the laser distortion is relatively small, equations (1) to (4) combine to give:

$$v_2 = B_1 b_1 v_{in} + (B_1 b_2 + B_2 b_1^2) v_{in}^2 \quad (5)$$

$$P = (a_1 B_1 b_1 v_{in}/R_1) + ((a_1(B_1 b_2 + B_2 b_1^2)/R_1) + (a_2 B_1^2 b_1^2 / R_1^2)) v_{in}^2 \quad (6)$$

Consequently, a linear system can be achieved with:

$$\frac{a_1 b_2}{a_2 b_1} = \frac{-B_1 b_1}{R_1 (1 + (B_2 b_1^2 / b_2 B_1))} \quad (7)$$

When a transformer is used to match the amplifier output impedance $R_1$ to $R_2$, a linear system can be achieved with:

$$\frac{a_1 b_2}{a_2 b_1} = \frac{-B_1 b_1}{(R_1 R_2)^{1/2} (1 + (B_2 b_1^2 / b_2 B_1))} \quad (8)$$

Equations 7 and 8 illustrate that a linear system can be realized by controlling the gain of the unbalanced amplifiers ($B_1$, $b_1$), the voltage offset ($b_2/b_1$ and $B_2/B_1$), and the impedance matching ($R_1$ and $R_2$).

The amplifiers used with the present invention can be built from such standard semiconductor devices as silicon bipolar Transistors, MESFETs, HBTs, HEMTs or GaAs RF amplifiers. The amplifiers of the present invention can be hybrid or MMIC. An alternate embodiment of the circuit of the present invention may contain more than two stages of unbalanced amplification and may involve some negative feedback in order to obtain a good frequency response.

Preferably, an RF MMIC is used. The advantage of these RF circuits is their small size. This enables the assembly of the predistortion circuit and laser together on a small area of a circuit board which helps reduce parasitic effects.

The present invention and the foregoing analysis apply to a predistortion circuit having any number of amplifiers in cascade. If $B_1=1$, one amplifier is present. If $B_1<1$, the system acts as an RF attenuator. Given that the number of amplifiers is equal to n, where n is greater than 2, n−1 amplifiers may be combined together into one equivalent amplifier to fit the foregoing analysis.

The tilt circuit is used to compensate for the possible frequency response change caused by the DC voltage offset of the RF amplifiers and laser frequency response variations. The final purpose of the tilt circuit is to produce a flat carrier to noise ratio across the entire frequency range.

Figure 5:
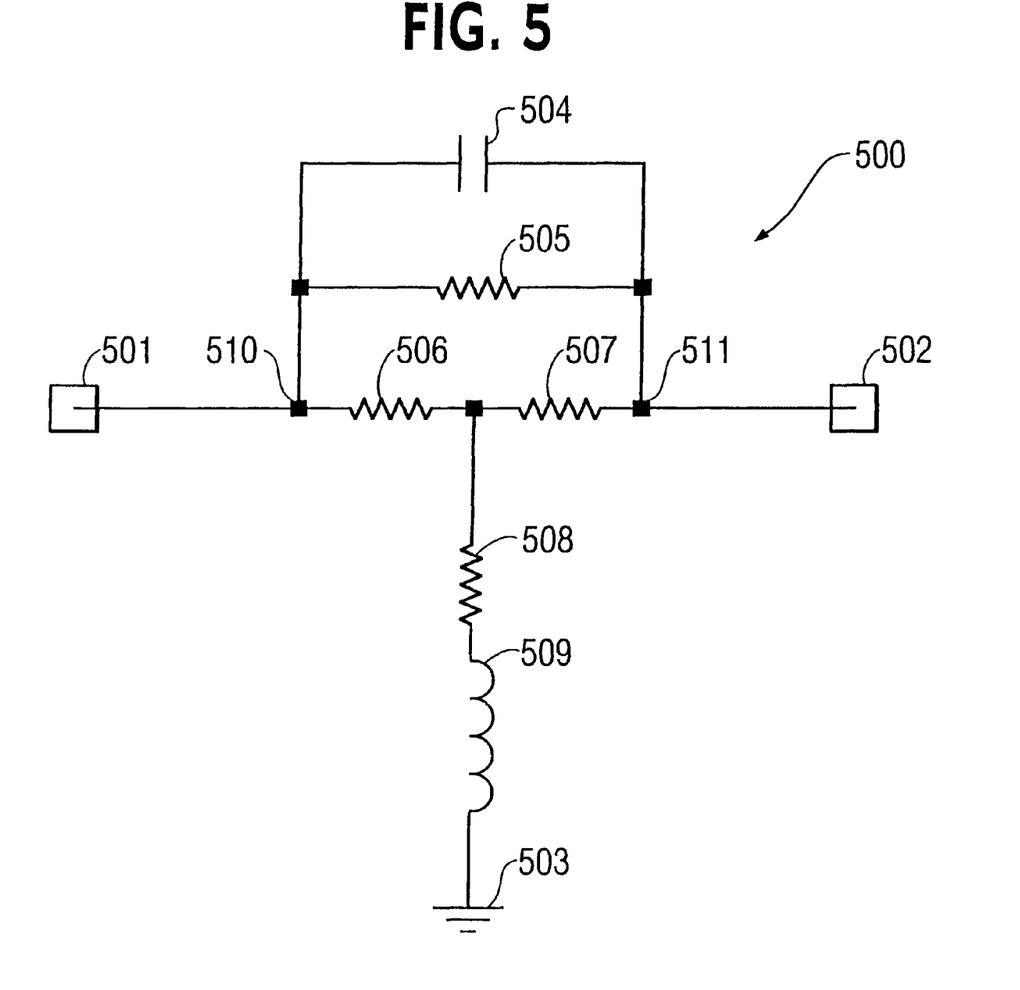
FIG. 5 is a circuit diagram of a tilt circuit according to the present invention which may be used in connection with the predistortion circuit of FIG. 2.

FIG. 5 illustrates a tilt circuit contemplated for use as part of the present invention with the predistortion circuit of FIG. 2. As shown in FIG. 5, the tilt circuit of the present invention may be embodied as follows. A capacitor 504, a resistor 505 and a pair of resistors connected in series 506 and 507 are all connected in parallel between a pair of nodes 510 and 511.

The input signal is provided to an input terminal 501 which is connected to node 510. An output terminal 502 is connected to node 511. The output of the tilt circuit is provided from output terminal 502 to, for example, the predistortion circuit of the present invention illustrated in FIG. 2. From a point between the two resistors connected in series 506 and 507, a resistor 508 and an inductor 509 are connected in series to ground.

This tilt circuit and the principles behind its construction and use are different from the teachings of the prior art. For example, the prior art uses tilt circuits within predistortion circuits to match the amplitude variation of the laser distortion. However, when a tilt circuit changes signal amplitude, it also changes signal phase across the entire frequency band. If, as in the prior art, the tilt circuit is operating within the predistortion circuit, this phase alteration will degrade the correction results by changing the phase relationship between the distortion vector and the correction vector.

In the present invention, the tilt circuit 500 of FIG. 5 is used before the input stage of the predistortion circuit of FIG. 2, for example. Thus, in principle, the tilt circuit 500 is not part of the pre-distortion circuit. Therefore, the phase shift produced by the tilt circuit 500 will not reduce the ability of the predistortion circuit to produce the proper phase relationship between the correction and the distortion vectors.

As discussed above, second-order distortion is the distortion that primarily limits the accurate transmission of optical data signals. Accordingly, the present invention as presented herein is addressed primarily to correcting second-order distortion.

If nothing is done to correct third order distortion, the following additional precautions should be observed.

1) High third order intercept power point IP3 RF balanced amplifiers should be used.

2) The CTB problem can be further relived by only offsetting the DC voltage of the first stage RF amplifier while keeping the DC voltage supplied to the second stated balanced.

Due to the amplification of the second stage, the input RF signal level in the first stage will be much lower than the input RF level of the second stage. With this arrangement, the RF circuit will produce only negligible CTB distortion.

3) The DFB lasers to be used must have low CTB distortion. Most of the commercially available DFB lasers fulfill this requirement.

If CTB distortion is not a problem, both the first and second stages of the predistortion circuit may have an offset DC voltage to produce optimal predistortion in the signal being processed. However, in most cases, offsetting the DC voltage of only the first stage will be sufficient to obtain good correction results.

However, in principle, the circuit of the present invention can be combined with another in-line third order predistortion circuit to correct third order distortions. In this way, both of the second and third order distortion can be corrected.

In testing the present invention as disclosed herein, commercially available DFB lasers were used, for example, 2 mW to 20 mW Fujitsu lasers. In the AM analog CATV frequency range, the intrinsic distortion of such lasers is not large. Most commercially available DFB lasers have very flat frequency response, with distortion caused mainly by L-I non-linearity. For purposes of the present invention, the unbalanced amplifiers can be selected from suitable, commercially available RF MMIC, for example, the Anadigics ACA 0860-D.

The laser power which can be corrected has been shown to range from at least 2 mw to 20 mw for 77 to 110 channels. A reduction in CSO distortion of 8 to 10 dB can be obtained across the entire band. In the best case scenario, reduction in CSO distortion is over 10 db across the band. CTB distortion after correction can actually be better than the CTB distortion inherently produced by the laser. After correction, a laser transmitter employing the present invention meets all specifications of the CATV industry.

One of the advantages of in-line voltage predistortion circuits of the present invention is that the distortion correction can be controlled electronically thereby making remote control of the predistortion possible. This greatly facilitates routine performance checks and automatic readjustments, thereby improving the reliability and overall performance of the system.

Moreover, in the cases of long-distance transmissions over optical fibers, field adjustment may be necessary to compensate for CSO distortion produced by dispersion caused by the optical fiber. This CSO distortion is dependent on the fiber being used and cannot be known or quantified until the fiber is in use. The ability to electronically readjust the predistortion circuit to compensate for the dispersion caused by the fiber allows the transmission to be improved regardless of the fiber used to carry the signal. Experiments show that using this inline unbalanced RF predistortion circuit, with a 30 Km fiber transmitter, the wavelength change tolerance is 10 nm.

The preceding description has been presented only to illustrate and describe the invention. It is not intended to be exhaustive or to limit the invention to any precise form disclosed. Many modifications and variations are possible in light of the above teaching. For example, while contemplated for correction of optical video transmissions in a CATV enterprise, the present invention may be used to compensate for distortion in any non-linear signal generator, e.g. an amplifier.

The preferred embodiment was chosen and described in order to best explain the principles of the invention and its practical application. The preceding description is intended to enable others skilled in the art to best utilize the invention in various embodiments and with various modifications as are suited to the particular use contemplated. It is intended that the scope of the invention be defined by the following claims.

What is claimed is:

1. An in-line predistortion circuit comprising:
    a plurality of amplifier stages connected in cascade for receiving and predistorting an input signal prior to said input signal being provided to a non-linear signal processing element;
    each of said amplifier stages further comprising a pair of voltage rails for supplying a pair of DC voltage levels to that amplifier stage, at least one pair of said DC voltage levels supplied to one of said amplifier stages is unequal to effect said predistorting;
    wherein a first of said amplifier stages is configured to produce a pair of intermediate signals 180 degrees out of phase.

2. A predistortion circuit as claimed in claim 1, wherein each of said voltage rails comprises an inductor.

3. A predistortion circuit as claimed in claim 1, wherein said first of said amplifier stages further comprises:
    an input terminal to which said input signal is provided;
    an amplifier; and
    a balun connected to said input terminal and configured to produce said pair of intermediate signals.

4. A predistortion circuit as claimed in claim 3, wherein said balun includes a primary winding connected between said input terminal and a first input terminal of said amplifier, and a secondary winding connected between ground and a second input terminal of said amplifier, said circuit further comprising:
    a first capacitor connected between said primary winding and said first input terminal of said amplifier; and
    a second capacitor connected between said second winding and said second input terminal of said amplifier.

5. A predistortion circuit as claimed in claim 1, wherein a second of said plurality of amplifier stages comprises:
    an output terminal to which said input signal is provided after processing by said plurality of amplifier stages;
    an amplifier; and
    a balun having a primary winding connected between said output terminal and a first output terminal of said amplifier, and a secondary winding connected between ground and a second output terminal of said amplifier.

6. A predistortion circuit as claimed in claim 5, further comprising:
    a first capacitor connected between said first output terminal of said amplifier and said primary winding; and
    a second capacitor connected between said second output terminal of said amplifier and said secondary winding.

7. A predistortion circuit a claimed in claim 1, further comprising an impedance matching element connected to an output terminal of said plurality of amplifier stages.

8. A predistortion circuit as claimed in claim 3, further comprising a second stage of said plurality of amplifier stages connected to said first stage, wherein said second stage comprises:
    an output terminal to which said input signal is provided after processing by said plurality of amplifier stages;
    a second amplifier;
    a second balun having a primary winding connected between said output terminal and a first output terminal of said second amplifier, and a secondary winding connected between ground and a second output terminal of said amplifier.

9. A predistortion circuit as claimed in claim 1, further comprising a tilt circuit, an output of which is connected to an input of said plurality of amplifier stages.

10. A predistortion circuit as claimed in claim 9, wherein said tilt circuit comprises:
    a capacitor, a resistor and a pair of resistors in series which are connected in parallel; and
    a resistor and an inductor connected in series between ground and a point between said two resistors in series.

11. A predistortion circuit as claimed in claim 1, further comprising a tilt circuit, an input of which is connected to an output of said plurality of amplifier stages.

12. A predistortion circuit as claimed in claim 11, wherein said tilt circuit comprises:
    a capacitor, a resistor and a pair of resistors in series which are connected in parallel; and a resistor and an inductor connected in series between ground and a point between said two resistors in series.

13. A method of providing corrective predistortion in an electronic input signal which is subject to distortion during subsequent processing, the method comprising predistorting said input signal by providing unequal DC voltage levels to at least one of a plurality of amplifier stages through which said input signal is passed, wherein a first of said amplifier stages comprises:

an input terminal to which said input signal is provided;

an amplifier;

a balun connected between said input terminal and said amplifier.

14. A method as claimed in claim 13, further comprising the step of controlling said predistortion by controlling a difference between said DC voltage levels supplied to said at least one of a plurality of amplifier stages.

15. A method as claimed in claim 13, further comprising the step of controlling said difference between said DC voltage levels, supplied over a pair of voltage rails by, controlling said DC voltage level of either one of said voltage rails.

16. A method as claimed in claim 13, further comprising the step of matching impedance with an impedance matching element connected to an output terminal of said plurality of amplifier stages.

17. A method of claim 13, wherein said balun includes a primary winding connected between said input terminal and a first terminal of said amplifier, and a secondary winding connected between ground and a second input terminal of said amplifier.

18. A method as claimed in claim 17, further comprising the step of connecting a second stage of said plurality of amplifier stages to said first stage, wherein said second stage comprises:

an output terminal to which said input signal is provided after processing by said plurality of amplifiers stages;

a second amplifier;

a second balun having a primary winding connected between said output terminal and a first output terminal of said second amplifier, and a secondary winding connected between ground and a second output terminal of said amplifier.

19. An in-line predistortion circuit comprising:

a plurality of amplifier stages connected in cascade for receiving and predistorting an input signal prior to said input signal being provided to a non-linear signal processing element;

each of said amplifier stages further comprising a pair of voltage rails for supplying a pair of DC voltage levels to that amplifier stage, at least one pair of said DC voltage levels supplied to one of said amplifier stages is unequal to effect said predistorting;

wherein a first of said stages comprise a balun configured to receive said input signal.

20. The circuit of claim 19, wherein said balun is configured to produce a pair of output signals 180 degrees out of phase.

21. The circuit of claim 19, further comprising a tilt circuit coupled to said amplifier stages and configured to effect a frequency response change.

22. The circuit of claim 1 wherein said circuit is configured to effect said predistortion over a frequency range corresponding to a plurality of channels of an AM analog cable television system.

* * * * *